United States Patent
An et al.

(10) Patent No.: US 7,367,003 B2
(45) Date of Patent: Apr. 29, 2008

(54) SYSTEM AND METHOD FOR VERIFYING TRACE LENGTHS AND TRACE SPACES IN A CIRCUIT

(75) Inventors: Fang An, Shen-Zhen (CN); Ming-Xiong Liao, Shen-Zhen (CN); Gong-Xian Deng, Shen-Zhen (CN)

(73) Assignees: Hong Fu Jin Precision Industry (Shenzhen) Co., Ltd., Bao-an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 346 days.

(21) Appl. No.: 11/178,547

(22) Filed: Jul. 11, 2005

(65) Prior Publication Data

US 2006/0015833 A1    Jan. 19, 2006

(30) Foreign Application Priority Data

Jul. 16, 2004    (TW) ............................... 93121311 A

(51) Int. Cl.
*G06F 17/50* (2006.01)

(52) U.S. Cl. ..................................................... 716/5
(58) Field of Classification Search ................... 716/5
See application file for complete search history.

(56) References Cited

U.S. PATENT DOCUMENTS

| 6,581,196 B2 | 6/2003 | Eisenberg et al. ............. 716/5 |
| 6,865,724 B2 * | 3/2005 | Eisenberg et al. ............. 716/5 |

* cited by examiner

*Primary Examiner*—Jack Chiang
*Assistant Examiner*—Brandon Bowers
(74) *Attorney, Agent, or Firm*—Morris Manning Martin LLP; Tim Tingkang Xia, Esq.

(57) ABSTRACT

The present invention provides a method for verifying trace lengths and trace spaces in a circuit. The method includes the steps of: retrieving information of a trace layout of the circuit; retrieving preset design rules on the trace lengths and the trace spaces of the trace layout; computing trace lengths and trace spaces of traces in the trace layout; verifying trace lengths and trace spaces in the trace layout by comparing the computed trace lengths and trace spaces of the traces with the preset design rules; and reporting results of the verifying step. A related system is also provided.

9 Claims, 3 Drawing Sheets

SYSTEM AND METHOD FOR VERIFYING TRACE LENGTHS AND TRACE SPACES IN A CIRCUIT

BACKGROUND OF THE INVENTION

1. Field of the Invention

The present invention is generally related to computer-enabled trace lengths and trace spaces verifying systems and methods, and more particularly, is related to a system and method for verifying trace lengths and trace spaces in a circuit.

2. General Background

Computer chip sizes are continuing to be miniaturized, and electrical signals thereof are being clocked at ever increasing frequencies. Even more that previously, high-speed, high-frequency signals being driven between chips via traces in a circuit (such as a integrated circuit, or a printed circuit board) are liable to detrimental impedance effects. One manifestation of these impedance effects is unwanted reflections due to impedance mismatches. The high-speed, high-frequency signals may also be prone to cross-talk and electromagnetic interference (EMI).

EMI is an electrical disturbance in an electronics-based system. EMI can be caused by natural phenomena such as lightning, by low-frequency waves emitted from electromechanical devices such as motors, or by high-frequency waves emitted from integrated circuits and other electronic devices such as routers. In the United States, the Federal Communications Commission sets limits on the EMI output of electronic devices. Other countries set their own limits on the EMI output of electronic devices. It is therefore necessary for all parties involved in the fabrication, manufacture, and/or sale of electronic devices to comply with the limitations imposed. In particular, it is necessary for manufacturers to ensure that EMI emissions of electronic devices in use are at or below the maximums imposed in relevant jurisdictions.

Both trace lengths and trace spaces between traces in a circuit are parameters affecting EMI emissions. In particular, the longer the trace length is, the more intense the EMI emissions are, in addition, the shorter the trace space between traces is, the more intense the EMI emissions are. Therefore, when constructing a trace layout for a circuit, it is necessary to verify the trace lengths and trace spaces between traces to insure that the EMI emissions caused by the traces meet the requirements imposed in the relevant jurisdiction(s). Additionally, such verification should be performed before the final physical layout of the circuit is determined, in order to avoid or minimize the difficult and expensive process of rectifying failed trace lengths and trace spaces between traces.

Accordingly, what is a need is a solution that verifying trace lengths and trace spaces in a circuit can be performed as early as possible in a trace layout design process of the circuit.

SUMMARY

Embodiments of the present invention provide a system and method for verifying trace lengths and trace spaces in a circuit.

Briefly described, one embodiment of the system among others, can be implemented as described herein. The system includes a database and a computer. The database is primarily used for storing information on preset design rules and computer aided design (CAD) data of a trace layout of the circuit based on a set of electro-magnetic interference (EMI) criteria. The computer includes a trace lengths and trace spaces verifying apparatus can be performed thereby. The trace lengths and trace spaces verifying apparatus can be used for: retrieving the information of the trace layout from the database; retrieving the preset design rules; selecting a first trace in the trace layout; selecting a second trace in the trace layout; computing a trace length for each of the two traces and trace spaces between the two traces; verifying if the trace lengths and the trace spaces satisfy the preset design rules; repeating the trace selecting, trace computing and design rules verifying for other trace in the trace layout; and adding design rule check (DRC) markers to the trace layout, where the DRC markers indicate which trace or traces have violated the preset design rules.

The present invention can also be viewed as providing methods for verifying trace lengths and trace spaces in a circuit. In this regard, one embodiment of such a method, among others, can be broadly summarized by the steps described hereinafter. The method may include the steps of: retrieving information of a trace layout of the circuit based on a set of electromagnetic interference (EMI) criteria from a database; retrieving preset design rules for the trace layout also from the database; selecting a first trace in the trace layout; selecting a second trace in the trace layout; computing a trace length for each of the two traces and trace spaces between the two traces; verifying if the trace lengths and the trace spaces satisfy the preset design rules; repeating the trace selecting, trace computing and design rules verifying for other traces in the trace layout; and adding design rule check (DRC) markers to the trace layout, where the DRC markers indicate which trace or traces have violated the preset design rules.

Another embodiment of such a method, among others, can be broadly summarized by the steps described hereinafter. The method may include the steps of: retrieving information of a trace layout of the circuit; retrieving preset design rules on the trace lengths and the trace spaces of the trace layout; computing trace lengths and trace spaces of traces in the trace layout; verifying trace lengths and trace spaces in the trace layout by comparing the computed trace lengths and trace spaces of the traces with the preset design rules; and reporting results of the verifying step.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

DETAILED DESCRIPTION OF THE PREFERRED EMBODIMENTS

Figure 1:
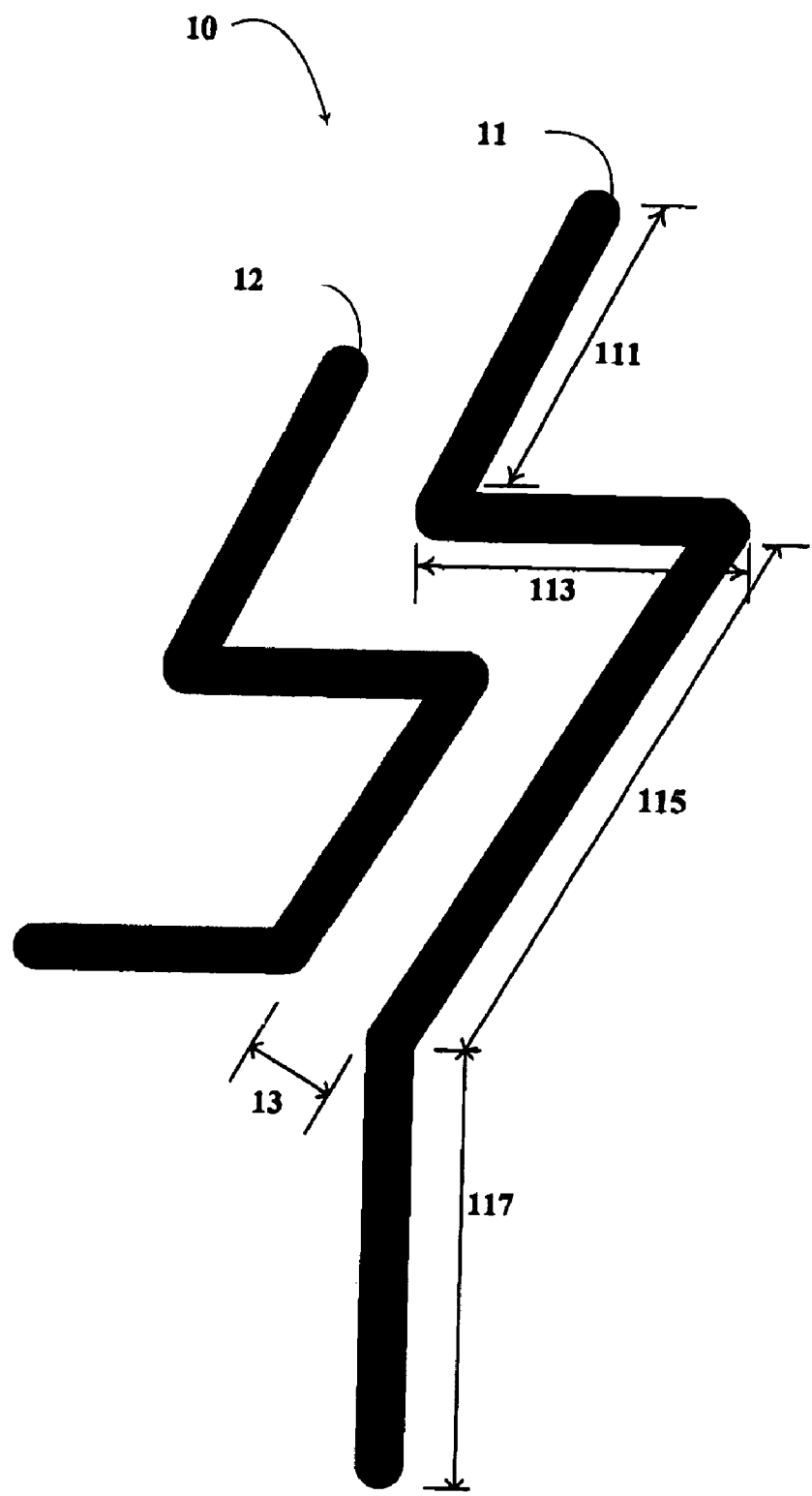
FIG. 1 is a schematic diagram showing an example of a trace layout of an integrated circuit in accordance with one embodiment of the present invention.

FIG. 1 is a schematic diagram showing an example of a trace layout of an integrated circuit in accordance with one embodiment of the present invention. The trace layout 10 includes a plurality of traces (only two shown, marked with 11 and 12) that transport a corresponding plurality of signals to and form the associated integrated circuit (IC). In this regard, it should be noted that the trace layout 10 is not part of the IC itself. Notwithstanding, the trace layout 10 typically has a set of computer aided design (CAD) data associated with it, where the CAD data results from and is used during the design process. A number of CAD software products such as commercially available "Cadence Advanced Package Designer" (CAPD) can be used to generate, manipulate, and view the CAD data associated with the trace layout 10, although no particular product is required. It should be noted that the trace layout 10 is typically but a small snapshot of a more complex collection of traces that interconnect processors, chip sets and other components in the IC environment. It should also be noted that although the present invention will be primarily described with regard to personal computer (PC) applications, the invention is not so limited. In fact, the principles described herein can be readily applied to any environment in which crosstalk is of concern.

The trace 11 or 12 in the trace layout 10 is flexuous instead of being always straight, because it has to walk around components embedded in the IC. Therefore, the trace 11 or 12 can be viewed as being consisting of a plurality of segments (only parts are shown, 111-117) by a corresponding plurality of connecting points. It should be noted that the two traces 11 and 12 should not be crossed, and, trace spaces 13 between the two traces 11 and 12 should exist. Considering crosstalk in the IC, trace lengths of traces in the IC should be limited with a max trace length threshold, while trace spaces between traces in the IC should be limited with a min trace space threshold.

Figure 2:
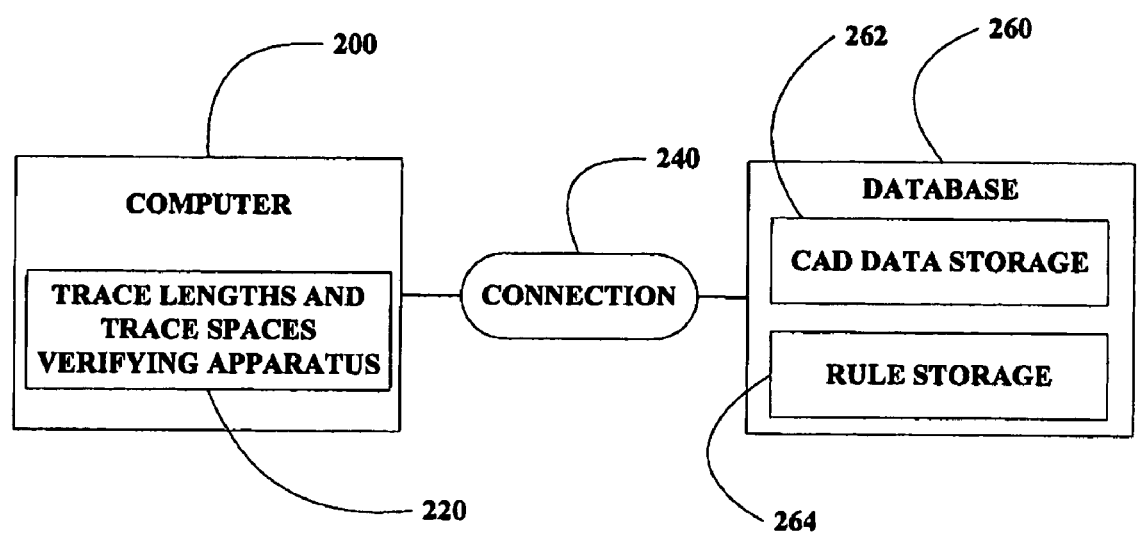
FIG. 2 is a block diagram of a system for verifying trace lengths and trace spaces in a circuit, in accordance with one embodiment of the present invention.

FIG. 2 is a block diagram of a system for verifying trace lengths and trace spaces in a circuit (hereinafter, "the system"), in accordance with one embodiment of the present invention. The system includes a database 260 associated with a computer 200 through a connection 240. The connection 240 is a database connectivity, such as an Open Database Connectivity (ODBC) or a Java Database Connectivity (JDBC). The database 260 includes a CAD data storage 262 for storing CAD data based on a set of electromagnetic interference (EMI) criteria, such as information on the trace layout 10 of the IC. The database 260 also includes a rule storage 264 for storing information on preset design rules. The computer 200 includes a trace lengths and trace spaces verifying apparatus 220 (hereinafter, "the apparatus 220"), which is used for performing a preferred method to verify if trace lengths and trace spaces in the trace layout 10 satisfy the preset design rules.

Figure 3:
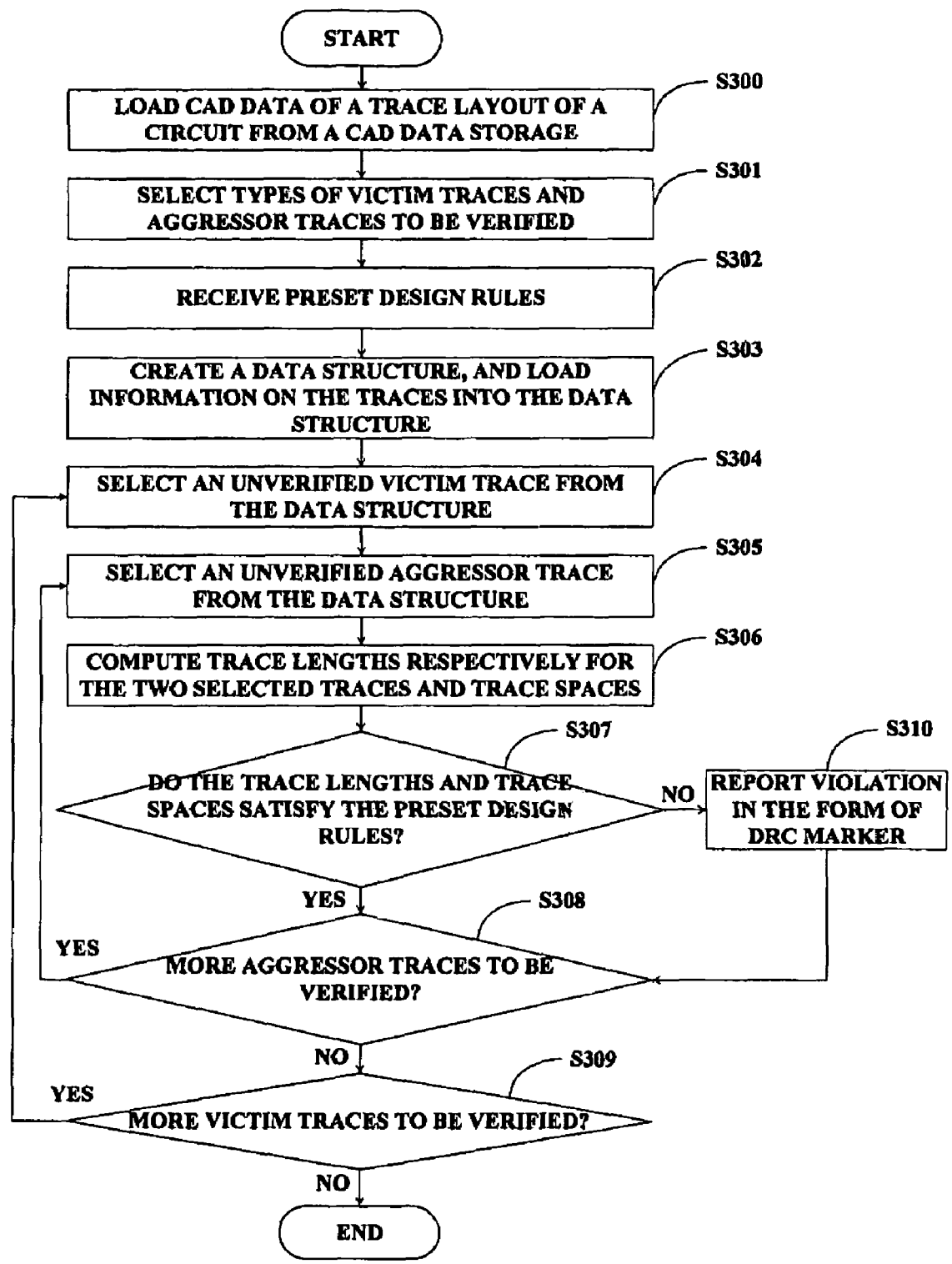
FIG. 3 is a flowchart of a preferred method for verifying trace lengths and trace spaces in a circuit, in accordance with one embodiment of the present invention.

FIG. 3 is a flowchart of a preferred method for verifying trace lengths and trace spaces in a circuit, in accordance with one embodiment of the present invention. The preferred computer-implemented method performed by the apparatus 220 associated with the database 260 is described below step by step in detail. In step S300, the apparatus 220 loads CAD data on the trace layout 10 of the IC from the CAD data storage 262 of the database 260, in order to retrieve the information on the trace layout 10. In step S301, the apparatus 220 shows a graphic user interface (GUI) for a user to select types of "victim traces" and "aggressor traces" to be verified. It should be noted that a "victim trace" is a trace interfered by an "aggressor trace". In this step, the apparatus 220 provides various types of traces for the user to select, such as clock traces, data traces, input and output (IO) traces, and high speed traces. These types of traces can be defined by a designer who designs the trace layout 10. The user may select all traces in the layout 10, if he or she wants to verify all the traces in the layout 10. In step S302, the apparatus 220 retrieves preset design rules defined by the user. The preset design rules are limitations on trace lengths and trace spaces of the layout 10. In detail, the preset design rules typically include a preset max trace length threshold and a preset min trace space threshold. In step 303, the apparatus 220 creates a data structure in a memory of the computer 200, and loads information on the traces of the trace layout 10 into the data structure for use by the apparatus 220. It should be noted that the preferred method is performed by the apparatus 220 associated with a central processing unit (CPU) and the memory of the computer 200.

After the step S303, the apparatus 220 starts to select traces to be verified in a typical order, and it should be noted that the typical order described below is not the only one option to those skilled in the art. In step 304, the apparatus 220 selects a first unverified victim trace of the trace layout 10 from the data structure in the memory. In step 305, the apparatus 220 selects a first unverified aggressor trace of the trace layout 10 from the data structure in the memory. Then, in step S306, the apparatus 220 computes a trace length for each of the two traces and trace spaces between the two traces. To compute a trace length for a trace (such as the victim trace or the aggressor trace selected by the apparatus 220) may further include the steps of: retrieving coordinate data of connecting points of the segments of the trace from the information of the trace layout; computing a length for each segment of the trace according to the coordinate data of the connecting points; and summing the lengths of all the segments of the trace to form the length of the trace. To computer trace spaces between the two traces (the victim trace and the aggressor trace selected by the apparatus 220) may further include the steps of: retrieving coordinate data of a first segment connecting point of one of the two traces from the information of the trace layout; retrieving coordinate data of a first segment connecting point of the other one of the two traces from the information of the trace layout; computing the trace space between the two first segment connecting points of the two traces; and repeating retrieving coordinate data of each of the two traces and computing trace spaces between segment connecting points of the two traces.

In step S307, the apparatus 220 verifies if the trace lengths of the two traces and the trace spaces between the two traces satisfy the preset design rules. If the trace lengths and the trace spaces do satisfy the preset design rules based on step S307, then in step S308, the apparatus 220 checks if there is any other unverified aggressor trace in the data structure. If there is not any other unverified aggressor trace based on step S308, then, in step S309, the apparatus 220 checks if there is any other unverified victim trace in the data structure. If there is not any other unverified victim trace based on step S309, the procedure of the method ends here.

On the other hand, if the trace lengths or the trace spaces do not satisfy the preset design rules based on step S307, in step S310, the apparatus 220 reports results of the verifying process in step S307 and then the procedure goes directly to step S308. The apparatus 220 may report the results (consisting mainly of violation against the preset design rules) in the form of design rule check (DRC) markers on the trace layout 10 or an output report. A typical commercially available CAD tool may provide the function of DRC marker on a trace layout, and the apparatus 220 calls the function in step S310.

In addition, if there are still one or more unverified aggressor traces based on step S308, the procedure of the method returns to step S305. Also, if there are still one or more unverified victim traces based on step S309, the procedure of the method returns to step S304.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

We claim:

1. A system for verifying trace lengths and trace spaces in a circuit, the system comprising:
   a database for storing information on preset design rules and computer aided design (CAD) data of a trace layout of the circuit based on a set of electro-magnetic interference (EMI) criteria; and
   a computer comprising a trace lengths and trace spaces verifying apparatus, the trace lengths and trace spaces verifying apparatus being for:
   retrieving the information of the trace layout from the database;
   retrieving the preset design rules;
   selecting a first trace in the trace layout;
   selecting a second trace in the trace layout;
   computing a trace length for each of the two traces, comprising:
   retrieving coordinate data of segment connecting points of each trace from the information of the trace layout;
   computing a length for each segment of the trace according to the coordinate data of the segment connecting points; and
   summing the lengths of all the segments of the trace to form the length of the trace;
   computing trace spaces between the two traces;
   verifying if the trace lengths and the trace spaces satisfy the preset design rules;
   repeating the trace selecting, trace computing and design rules verifying for other traces in the trace layout; and
   adding design rule check (DRC) markers to the trace layout, where the DRC markers indicate which trace or traces have violated the preset design rules.

2. The system according to claim 1, wherein the trace lengths and trace spaces verifying apparatus computing the trace spaces between the two traces comprises:
   retrieving coordinate data of a first segment connecting point of one of the two traces from the information of the trace layout;
   retrieving coordinate data of a first segment connecting point of the other one of the two traces from the information of the trace layout;
   computing the trace space between the two first segment connecting points of the two traces; and
   repeating retrieving coordinate data of each of the two traces and computing trace spaces between segment connecting points of the two traces.

3. The system according to claim 1, wherein the preset design rules comprise a preset max trace length threshold and a preset min trace space threshold.

4. A computer-implemented method for verifying trace lengths and trace spaces in a circuit, the method comprising:
   retrieving information of a trace layout of the circuit based on a set of electro-magnetic interference (EMI) criteria from a database;
   retrieving preset design rules for the trace layout also from the database;
   selecting a first trace in the trace layout;
   selecting a second trace in the trace layout;
   computing a trace length for each of the two traces, comprising:
   retrieving coordinate data of segment connecting points of each trace from the information of the trace layout;
   computing a length for each segment of the trace according to the coordinate data of the segment connecting points; and
   summing the lengths of all the segments of the trace to form the length of the trace; computing trace spaces between the two traces;
   verifying if the trace lengths and the trace spaces satisfy the preset design rules;
   repeating the trace selecting, trace computing and design rules verifying for other traces in the trace layout; and
   adding design rule check (DRC) markers to the trace layout, where the DRC markers indicate which trace or traces have violated the preset design rules.

5. The method according to claim 4, wherein the step of computing the trace spaces between the two traces comprises:
   retrieving coordinate data of a first segment connecting point of one of the two traces from the information of the trace layout;
   retrieving coordinate data of a first segment connecting point of the other one of the two traces from the information of the trace layout;
   computing the trace space between the two first segment connecting points of the two traces; and
   repeating retrieving coordinate data of each of the two traces and computing trace spaces between segment connecting points of the two traces.

6. The method according to claim 4, wherein the preset design rules further comprise a preset max trace length threshold and a preset min trace space threshold.

7. A method for verifying trace lengths and trace spaces in a circuit, the method comprising:
   retrieving information of a trace layout of the circuit;
   retrieving preset design rules on the trace lengths and the trace spaces of the trace layout;
   computing trace spaces between any two traces in the trace layout, comprising:
   retrieving coordinate data of a first segment connecting point of one of the two traces from the information of the trace layout;
   retrieving coordinate data of a first segment connecting point of the other one of the two traces from the information of the trace layout;
   computing the trace space between the two first segment connecting points of the two traces; and
   repeating retrieving coordinate data of each of the two traces and computing trace spaces between segment connecting points of the two traces;
   computing trace lengths of traces in the trace layout;

verifying trace lengths and trace spaces in the trace layout by comparing the computed trace lengths and trace spaces of the traces with the preset design rules; and reporting results of the verifying step.

8. The method according to claim 7, wherein the step of computing a trace length for a trace out of the traces in the trace layout comprises:

retrieving coordinate data of segment connecting points of the trace from the information of the trace layout;

computing a length for each segment of the trace according to the coordinate data of the segment connecting points; and summing the lengths of all the segments of the trace to form the length of the trace.

9. The method according to claim 7, wherein the preset design rules comprise a preset max trace length threshold and a preset min trace space threshold.

* * * * *